(12) United States Patent
Hong et al.

(10) Patent No.: US 11,050,039 B2
(45) Date of Patent: Jun. 29, 2021

(54) ORGANIC LIGHT EMITTING DISPLAY DEVICE AND METHOD FOR MANUFACTURING COVER WINDOW THEREOF

(71) Applicant: LG Display Co., Ltd., Seoul (KR)

(72) Inventors: Jin-Woo Hong, Seoul (KR); Wan-Seop Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/693,026

(22) Filed: Nov. 22, 2019

(65) Prior Publication Data
US 2020/0168838 A1  May 28, 2020

(30) Foreign Application Priority Data
Nov. 26, 2018 (KR) .......................... 10-2018-0147233

(51) Int. Cl.
| | |
|---|---|
| *H01L 51/52* | (2006.01) |
| *H01L 51/56* | (2006.01) |
| *H01L 27/32* | (2006.01) |
| *G02F 1/1343* | (2006.01) |
| *G02F 1/1335* | (2006.01) |
| *G02F 1/13* | (2006.01) |

(52) U.S. Cl.
CPC ........ *H01L 51/5246* (2013.01); *G02F 1/1323* (2013.01); *G02F 1/13439* (2013.01); *G02F 1/133524* (2013.01); *H01L 51/5275* (2013.01); *H01L 51/5284* (2013.01); *H01L 51/56* (2013.01); *H01L 27/3244* (2013.01); *H01L 2251/558* (2013.01)

(58) Field of Classification Search
CPC ............ G02F 1/1323; G02F 1/133502; G02F 1/133512; G02F 1/133509; H01L 51/5284; H01L 51/5275; H01L 51/56; H01L 51/5246; H01L 2251/558
See application file for complete search history.

(56) References Cited

U.S. PATENT DOCUMENTS

| | | | | |
|---|---|---|---|---|
| 7,985,466 | B2* | 7/2011 | Saitoh | B32B 25/20 |
| | | | | 428/212 |
| 2012/0281289 | A1* | 11/2012 | Itoh | G02F 1/133504 |
| | | | | 359/599 |
| 2015/0346388 | A1* | 12/2015 | Han | G02B 1/105 |
| | | | | 359/586 |
| 2020/0049864 | A1* | 2/2020 | Huang | G02B 5/003 |

\* cited by examiner

*Primary Examiner* — Jose R Diaz
(74) *Attorney, Agent, or Firm* — Seed IP Law Group LLP

(57) ABSTRACT

Disclosed are an organic light emitting display device and a method for manufacturing a cover window thereof. The organic light emitting display device includes a display panel configured to display an image, and a cover window located above the display panel. The cover window includes a light path control structure configured to adjust a range of visibility of the image displayed by the display panel and to prevent occurrence of ghost mura.

15 Claims, 9 Drawing Sheets

300

ORGANIC LIGHT EMITTING DISPLAY DEVICE AND METHOD FOR MANUFACTURING COVER WINDOW THEREOF

CROSS-REFERENCED TO RELATED APPLICATION(S)

This application claims the benefit of Korean Patent Application No. 10-2018-0147233, filed Nov. 26, 2018, which is hereby incorporated by reference as if fully set forth herein.

BACKGROUND

Technical Field

The present disclosure relates to an organic light emitting display device and a method for manufacturing a cover window thereof.

Description of the Related Art

An organic light emitting display device is a device which displays an image by controlling an amount of light emitted by organic light emitting devices. The organic light emitting devices (organic light emitting diodes, etc.) are self-luminous devices using a thin light emitting layer between electrodes, and have advantages, such as thinness. In general, the organic light emitting display device has a structure in which pixel driving circuits and organic light emitting devices are formed on a substrate, and displays an image as light emitted by the organic light emitting devices passes through the substrate or a barrier layer.

The organic light emitting display device is operated without a separate light source, and may thus be manufactured to have a smaller thickness and a lighter weight than conventional display devices, such as a liquid crystal display (LCD). Therefore, the organic light emitting display device may be easily implemented as flexible, bendable and foldable display devices and thus be designed in various types.

Therefore, an application range of the organic light emitting display device is gradually increased to various fields, e.g., not only traditional electronic devices, such as a TV, but also an instrument panel for vehicles, indoor and outdoor billboards, etc. Here, optimization satisfying respective display device usage environments is required and, as circumstances require, a specific structure and a complementary member in which a usage environment is reflected may be further added to the organic light emitting display device.

BRIEF SUMMARY

Accordingly, the present disclosure is directed to an organic light emitting display device and a method for manufacturing a cover window thereof that substantially obviate one or more problems due to limitations and disadvantages of the related art.

The present disclosure provides an organic light emitting display device and a method for manufacturing a cover window used therein.

The present disclosure further provides a light path control structure integrated with a cover window.

Additional advantages, and features of the disclosure will be set forth in part in the description which follows and in part will become apparent to those having ordinary skill in the art upon examination of the following or may be learned from practice of the disclosure. The advantages of the disclosure may be realized and attained by the structure particularly pointed out in the written description and claims hereof as well as the appended drawings.

To achieve the advantages according to the present disclosure, as embodied and broadly described herein, an organic light emitting display device includes a display panel configured to display an image and a cover window located above the display panel, wherein the cover window includes a light path control structure configured to adjust a range of visibility of the image displayed by the display panel and to prevent occurrence of ghost mura.

The light path control structure may include light blocking patterns configured to block light incident upon the cover window at a designated angle or more, a refractive index matching layer configured to cover the light blocking patterns and to prevent the light incident upon the cover window from being totally reflected by the light blocking patterns, and a light transmission part configured to transmit light incident upon the cover window at less than the designated angle.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
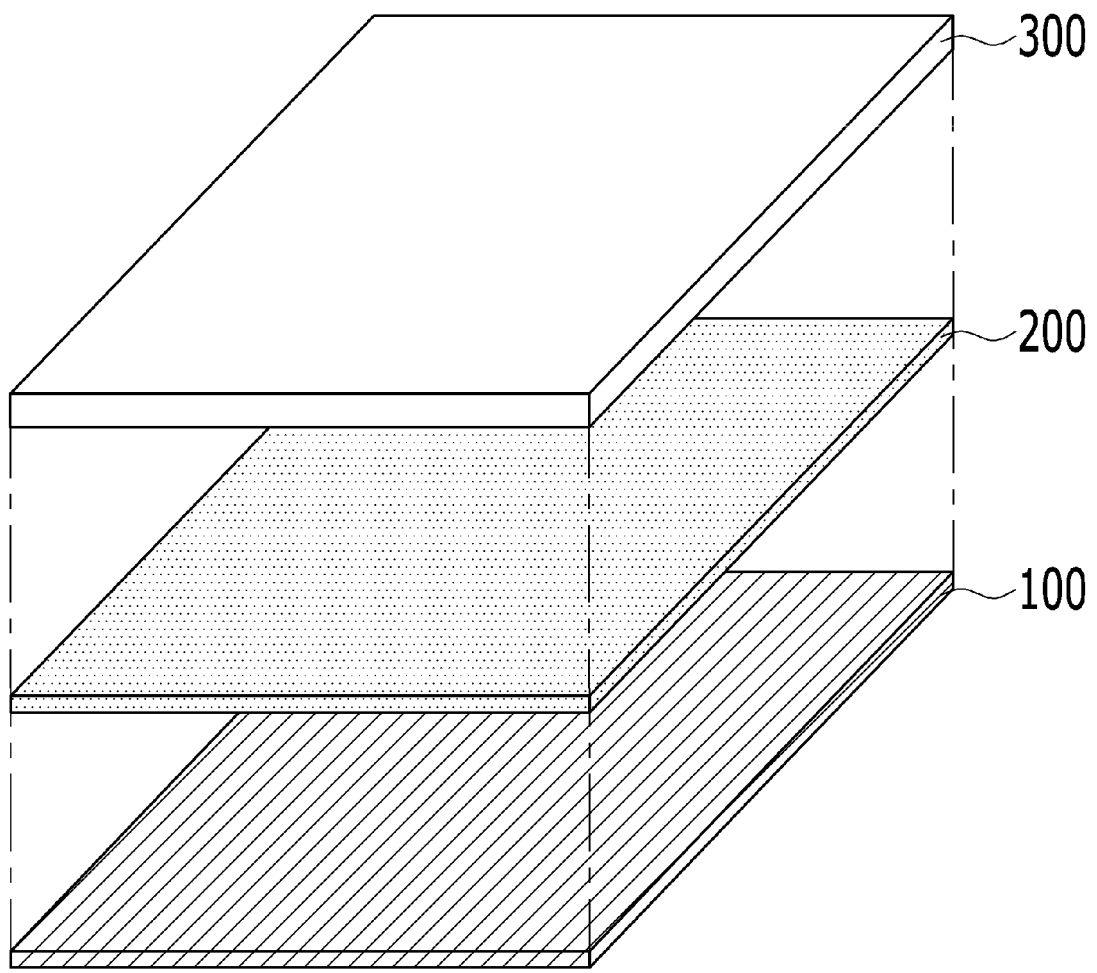
FIG. 1 is an exploded perspective view schematically illustrating an organic light emitting display device in accordance with one embodiment of the present disclosure.

Reference will now be made in detail to the preferred embodiments of the present disclosure, examples of which are illustrated in the accompanying drawings. However, the present disclosure may be embodied in many alternative forms and should not be construed as limited to the embodiments set forth herein, the embodiments of the present disclosure are provided only to completely disclose the disclosure and to completely inform those skilled in the art of the scope of the disclosure, and the present disclosure is defined by the scope of the appended claims and their equivalents.

Shapes, sizes, rates, angles, numbers, etc., disclosed in the drawings to describe the embodiments of the present disclosure are only exemplary and do not limit the present disclosure. In the following description of the embodiments of the present disclosure, a detailed description of known functions and configurations incorporated herein will be omitted when it may make the subject matter of the present disclosure rather unclear. In the following description of the embodiments, the terms 'including,' 'having,' 'consisting of,' etc., will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element includes a plural expression of the element unless stated otherwise.

In interpretation of elements included in the various embodiments of the present disclosure, it will be interpreted that the elements include error ranges even if there is no clear statement.

In the following description of the embodiments, it will be understood that, when positional relations are expressed, for example, when an element is 'on,' 'above,' 'under,' 'beside,' etc., another element, the two elements may directly contact each other, or one or more other elements may be interposed between the two elements unless the term 'just' or 'directly' is used.

In the following description of the embodiments, it will be understood that, when a device or layer is 'on' another device or layer, one or more other devices or layers may be placed just on the latter device or layer or be interposed between the two devices or layers.

In the following description of the embodiments, it will be understood that, when the terms 'first,' 'second,' etc., are used to describe various elements, these terms are used merely to discriminate the same or similar elements. Therefore, an element modified by the term 'first' may be the same as an element modified by the term 'second' within the technical scope of the disclosure unless stated otherwise.

In the following description of the embodiments and the drawings, the same or similar elements are denoted by the same reference numerals even though they are depicted in different drawings.

Sizes and thicknesses of respective elements illustrated in the drawings to describe the embodiments of the present disclosure are only exemplary and do not limit the present disclosure.

Characteristics of the various embodiments of the present disclosure may be partially or entirely connected to or combined with each other and technically variously driven and interlocked with each other so as to become apparent to those skilled in the art, and the respective embodiments may be independently implemented or be implemented together in connection with each other.

Hereinafter, the embodiments of the present disclosure will be described in detail with reference to the accompanying drawings.

An organic light emitting display device 1000 may include a display panel 100 configured to display an image, a functional member 200, a cover member 300 and various mechanical components (for example, a frame, a case, etc.).

The display panel 100 includes at least one active area, and pixels, e.g., basic units to display an image, are arranged in an array in the active area. One or more inactive areas may be arranged around the active area. That is, the inactive areas may be arranged adjacent to one or more side surfaces of the active area. The active area and the inactive areas may have a shape proper to the design of an electronic device in which the organic light emitting display device 100 is mounted (e.g., a pentagon, a hexagon, a circle, an oval or the like).

Each pixel in the active area may be related to a pixel circuit. The pixel circuit may include one or more switching transistors and one or more driving transistors. Each pixel circuit may be conductively connected to a gate line and a data line so as to communicate with one or more driving circuits, such as a gate driver and a data driver located in the inactive area. The driving circuit may be implemented as a thin film transistor (TFT) in the inactive area. Such a driving circuit may be referred to as a gate-in-panel (GIP). Further, some parts, such a data driver IC, may be mounted on a separate printed circuit board, and be connected to a connection interface (for, example, a pad, a bump, a pin or the like) arranged in the inactive area using a circuit film, such as a flexible printed circuit board (FPCB), a chip-on-film (COF), a tape-carrier-package (TCP) or the like. The display panel 100 may include various additional elements to generate various signals or to drive the pixels in the active area. The additional elements may include an inverter circuit, a multiplexer, an electrostatic discharge circuit, etc.

The functional member 200 may be provided to reinforce mechanical and optical characteristics for the organic light emitting display device 1000. The functional member 200 may include additional elements related to functions besides driving of the pixels. For example, the functional member 200 may include additional elements to provide a touch sensing function, a user authentication function (for example: fingerprint recognition), a multi-lever pressure sensing function, a tactile feedback function, etc. Further, the functional member 200 may include a polarizer to control display characteristics (for example, reflection of external light, color accuracy, luminance, etc.), etc. The functional member 200 may be adhered to the upper surface of the display panel 100 by an adhesive.

The cover member 300 is adhered to the functional member 200 so as to protect the display panel 100 and the functional member 200 provide thereon. The cover member 300 may be formed of a transparent material (glass, plastic or the like) so that the active area is visible. However, an opaque shielding layer 350 (in FIG. 3A) is provided at a part of the cover member 300 which is hidden from a user (e.g., the inactive area). The cover member 300 is adhered to the upper surface of the functional member 200 by a transparent adhesive, such as an optically clear adhesive (OCA), thus transmitting light emitted from the display panel 100 to the outside and protecting the display panel 100 and the functional member 200 from external shock. The cover member 300 in accordance with one embodiment of the present disclosure may further include a light path control structure to adjust a range of visibility of an image displayed by the display panel 100, and a detailed description thereof will be given below with reference to FIG. 3A and subsequent figures.

Figure 2:
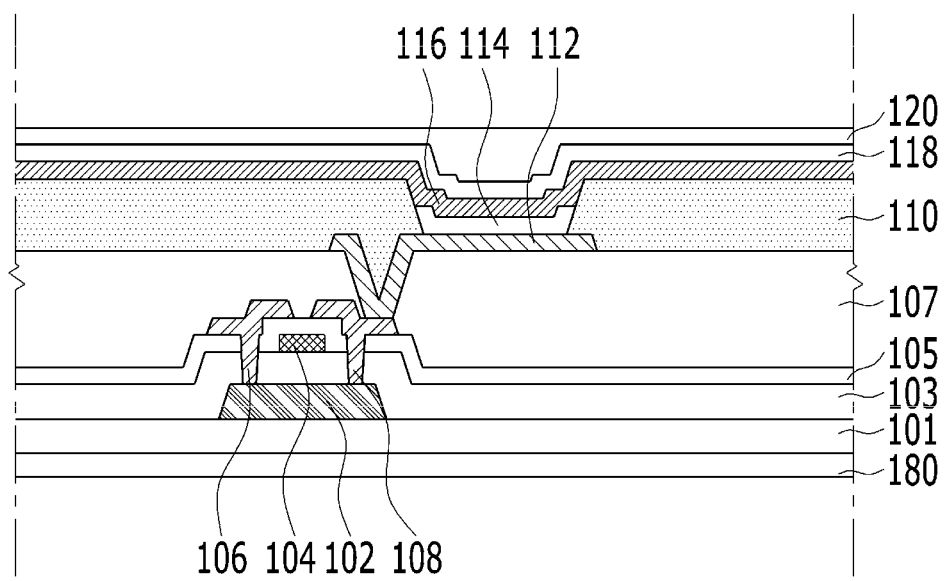
FIG. 2 is a cross-sectional view illustrating a portion of a display panel included in the organic light emitting display device of FIG. 1.

FIG. 2 is a cross-sectional view illustrating a portion of the display panel included in the organic light emitting display device of FIG. 1.

The display panel 100 includes thin film transistors, organic light emitting devices and various layers located on a base layer 101.

The base layer 101 supports various elements of the display panel 100. The base layer 101 may be formed of a transparent insulating material, for example, glass, plastic or the like. If the base layer 101 is formed of plastic, the base layer 101 may be referred to as a plastic film or a plastic substrate. For example, the base layer 101 may be formed as a film including one selected from the group consisting of a polyimide-based polymer, a polyester-based polymer, a silicon-based polymer, an acrylic polymer, a polyolefin-based polymer and copolymers thereof. Among these materials, polyimide is applicable to a high-temperature process and is coatable, and is thus mainly used as a plastic substrate. A substrate (an array substrate) may have a meaning of including devices and functional layers, for example, including switching TFTs, driving TFTs connected to the switching TFTs, organic light emitting devices connected to the driving TFTs, a protective film, etc., which are formed on the base layer 101.

During a manufacturing process, some parts of the organic light emitting display device 1000 may be exposed to external light. These parts and materials used to manufacture these parts undergo unwanted state change (for example, threshold voltage transition in the TFT, etc.) due to exposure to light during manufacture of the organic light emitting display device 1000. Some parts of the organic light emitting display device 1000 are excessively exposed to external light, as compared to other parts of the organic light emitting display device 1000. This may cause display non-uniformity (for example, mura, shadow defects, etc.). In order to reduce or minimize these problems, the base layer 101 may include at least one material which may reduce an amount of external light.

For example, a light blocking material is carbon black chloride mixed with the material of the base layer 101 (polyimide or other polymers). As such, the base layer 101 may be formed of polyimide having a shade providing a light blocking function. Such a base layer 101 reduces reflection of external light incident upon the front surface of the organic light emitting display device 1000, and may thus improve visibility.

A buffer layer may be located on the base layer 101. The buffer layer is a functional layer to protect thin film transistors (TFTs) from impurities, such as alkali ions leaked from the base layer 101 or lower layers. The buffer layer may have a monolayer structure including silicon oxide ($SiO_x$) or silicon nitride ($SiN_x$) or a multilayer structure including silicon oxide ($SiO_x$) and silicon nitride ($SiN_x$).

A thin film transistor is placed on the base layer 101 or the buffer layer. The thin film transistor may be formed by sequentially disposing a semiconductor layer 102, a gate insulating film 103, a gate electrode 104, an interlayer insulating film 105 and source and drain electrodes 106 and 108. The semiconductor layer 102 is located on the base layer 101 or the buffer layer. The semiconductor layer 102 may be formed of polysilicon (p-Si) and, in this case, a designated region of the semiconductor layer 102 may be doped with impurities. Further, the semiconductor layer 102 may be formed of amorphous silicon (a-Si) or be formed of various organic semiconductor materials, such as pentacene, etc. Moreover, the semiconductor layer 102 may be formed of an oxide. The gate insulating film 103 may be formed of an inorganic insulating material, such as silicon oxide ($SiO_x$) or silicon nitride ($SiN_x$), or be formed of an organic insulating organic. The gate electrode 104 may be formed of one of various conductive materials, for example, one selected from the group consisting of magnesium (Mg), aluminum (Al), nickel (Ni), chrome (Cr), molybdenum (Mo), tungsten (W), gold (Au) and alloys thereof.

The interlayer insulating film 105 may be formed of an insulating material, such as silicon oxide ($SiO_x$) or silicon nitride ($SiN_x$), or be formed of insulating organic matter. Contact holes to expose source and drain regions may be formed by selectively removing the interlayer insulating film 105 and the gate insulating film 103.

The source and drain electrodes 106 and 108 may be formed to have a monolayer or multilayer structure using a material for electrodes, on the interlayer insulating film 105.

A planarization layer 107 may be located on the thin film transistor. The planarization layer 107 protects the thin film transistor and planarizes the upper surface of the thin film transistor. The planarization layer 107 may be formed in various types, e.g., be formed as an organic insulating film including benzocyclobutene (BCB) or acryl, or an inorganic insulating film including silicon oxide ($SiO_x$) or silicon nitride ($SiN_x$), and be variously modified, e.g., be formed to have a monolayer structure or a bilayer or multilayer structure.

The organic light emitting device may be formed by sequentially disposing a first electrode 112, an organic light emitting layer 114 and a second electrode 116. That is, the organic light emitting device may include the first electrode 112 formed on the planarization layer 107, the organic light emitting layer 114 located on the first electrode 112, and the second electrode 116 located on the organic light emitting layer 114.

The first electrode 112 is conductively connected to the drain electrode 108 of the driving thin film transistor through a contact hole. If the display panel 100 is a top emission type, the first electrode 112 may be formed of an opaque conductive material having high reflectivity. For example, the first electrode 112 may be formed of one selected from the group consisting of silver (Ag), aluminum (Al), gold (Au), molybdenum (Mo), tungsten (W), chrome (Cr) and alloys thereof.

A bank 110 is formed in remaining areas except for a light emission area. Therefore, the bank 110 has a bank hole to expose the first electrode 112 corresponding to the light emission area. The bank 110 may be formed of an inorganic insulating material, such as silicon oxide ($SiO_x$) or silicon nitride ($SiN_x$), or an organic insulating material, such as BCB, acrylic resin or imide-based resin.

The organic light emitting layer 114 is located on the first electrode 112 exposed by the bank 110. The organic light emitting layer 114 may include a light emitting layer, an electron injection layer, an electron transport layer, a hole transport layer, a hole injection layer, etc. The light emitting layer may be formed to have a single light emitting layer structure which emits light of one color, or include a plurality of light emitting layers so as to emit white light through mixing of different colors of light emitted by the respective light emitting layers.

The second electrode 116 is located on the organic light emitting layer 114. If the display panel 100 is a top emission type, the second electrode 116 is formed of a transparent conductive material, such as indium tin oxide (ITO) or indium zinc oxide (IZO), or a transflective metal alloy, such as an MgAg alloy, and thus emits light generated by the organic light emitting layer 114 in the upward direction of the second electrode 116.

A protective layer 118 and an encapsulation layer 120 are located on the second electrode 116. The encapsulation layer 120 prevents penetration of oxygen and moisture from the outside so as to prevent oxidation of a light emitting material and an electrode material. When the organic light emitting device is exposed to moisture or oxygen, pixel shrinkage in which the light emitting area is shrunk may occur, or a dark spot in the light emitting area may occur. The encapsulation layer 120 may be formed as an inorganic film including glass, metal, aluminum oxide ($AlO_x$) or a silicon-based material, or a structure in which an organic film and an inorganic film are alternately stacked. The inorganic film serves to block penetration of oxygen, and the organic film serves to planarize the surface of the inorganic film. The reason why the encapsulation layer 120 includes a plurality of thin film layers is that such a structure lengthens and complicates a moving path of moisture or oxygen, as compared to a single layer, and thus hinders penetration of moisture/oxygen into the organic light emitting device.

In order to increase strength or rigidity of the display panel 100, one or more support layers 180 may be provided under the base layer 101. The support layer 180 is adhered to the other surface (e.g., a second surface) of the base layer 101 in opposition to one surface (e.g., a first surface) of the base layer 101 on which the organic light emitting device is located. The support layer 180 may be formed as a thin film including polyethylene naphthalate (PEN), polyethylene terephthalate (PET), polyethylene ether phthalate, polycarbonate, polyarylate, polyether imide, polyether sulfonate, polyimide, polyacrylate or a combination of other proper polymers. Other proper materials used to form the support layer 180 may be an ultrathin glass film, a metal foil film shielded by a dielectric, a multilayer polymer film, a polymer film including a polymer combined with nano-particles or micro-particles, etc. Other suitable materials may be utilized and thus are not limited to those enumerated above.

In order to reduce an amount of light incident from the rear surface of the organic light emitting display device 1000 (e.g., the surface of the organic light emitting display device to which the support layer 180 is adhered), instead of the base layer 101, the support layer 180 may include a light blocking material. The material of the support layer 180 may be mixed with one or more light blocking materials, in a similar manner as the above description. Furthermore, both the base layer 101 and the support layer 180 may include one or more light blocking materials. Here, the light blocking materials used in the base layer 101 and the support layer 180 need not be the same.

Figure 3A:
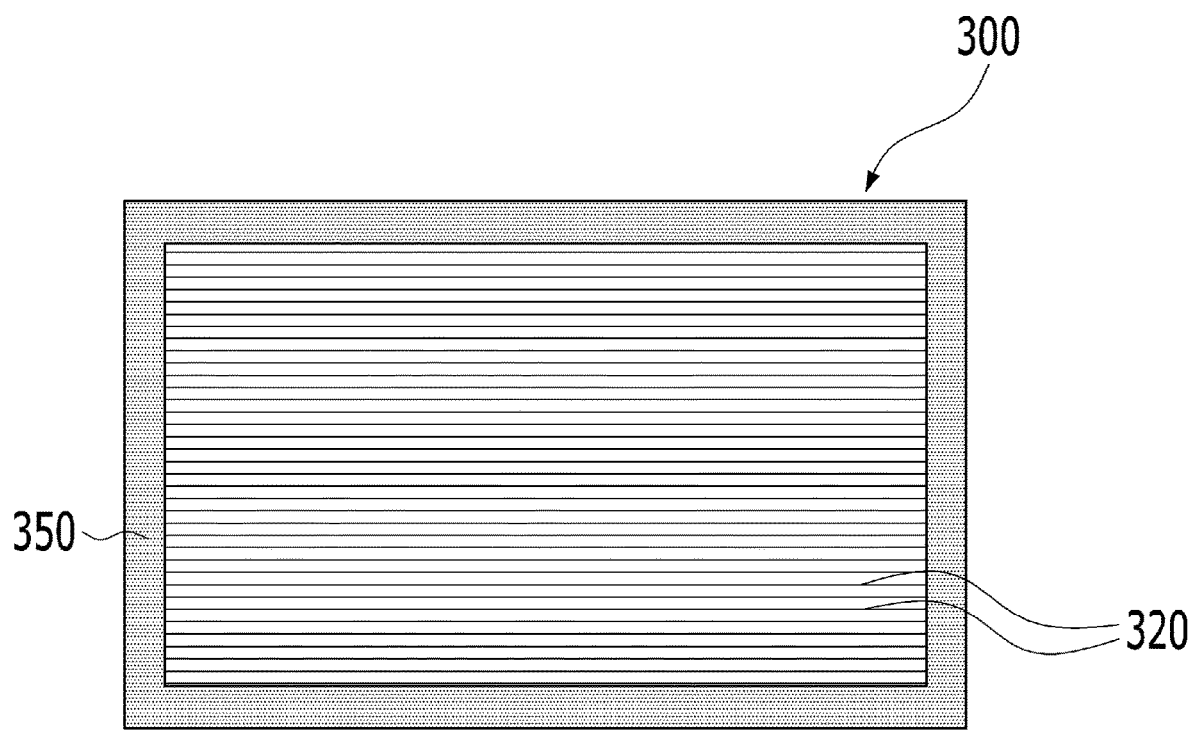
FIGS. 3A to 3E are views illustrating a cover member in accordance with one embodiment of the present disclosure.
Figure 3B:
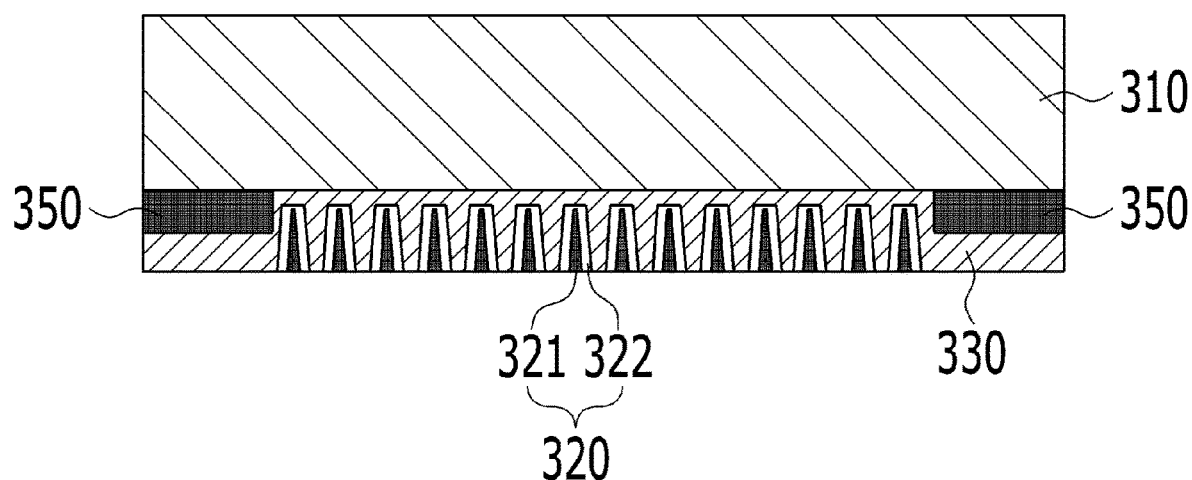

FIGS. 3A and 3B are views illustrating the cover member in accordance with one embodiment of the present disclosure.

FIG. 3A is a plan view of the cover member 300 in accordance with one embodiment of the present disclosure, and FIG. 3B is a cross-sectional view thereof. The cover member 300 is located on a display surface on which a viewer views an image, and may be referred as a cover window in some embodiments since the cover member 300 transmits the image as a transparent film or glass. The cover member 300 is located on the display panel 100 which displays an image. In one embodiment, the cover member 300 may be located above the display panel 100. Further, the cover member 300 may include a light path control structure provided to adjust a range of visibility of an image displayed by the display panel 100. That is to say, the light path control structure controls a viewing angle of the organic light emitting display device so as to be suitable for a service environment.

A specific display device requires a wide viewing angle so that a plurality of users may view an image together, but another display device may require restriction of a viewing angle within a specific range. For example, a display device for vehicles needs to adjust a viewing angle so that an image displayed on a display screen is not reflected in a front or side window. The range and level of adjustment of the viewing angle of the display device (in particularly, in the upward direction) are varied according to requirements of a manufacturer that manufactures an apparatus employing the corresponding display device.

Figure 3C:
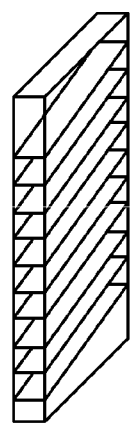
Figure 3C:
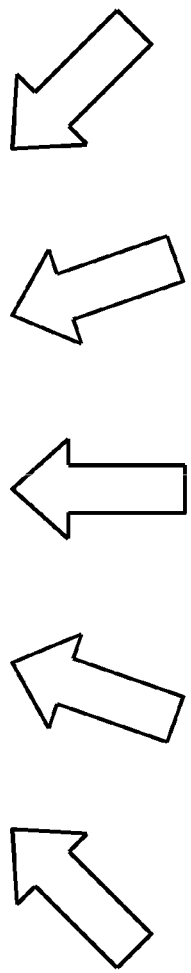
Figure 3C:
Figure 3C:
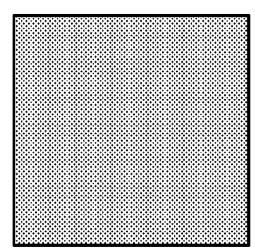
Figure 3C:
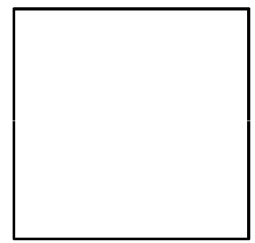
Figure 3C:
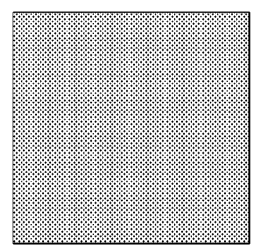
Figure 3C:
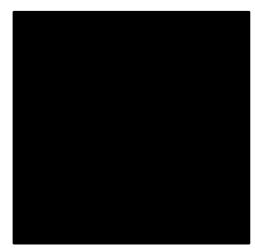
Figure 3D:
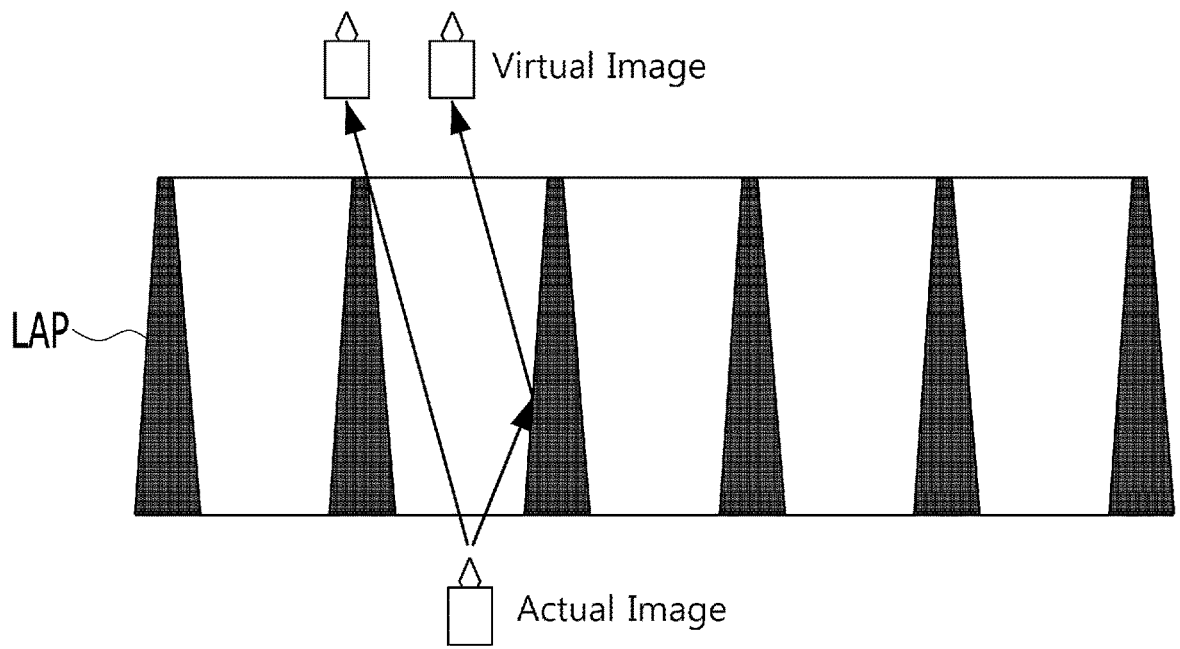
Figure 3E:
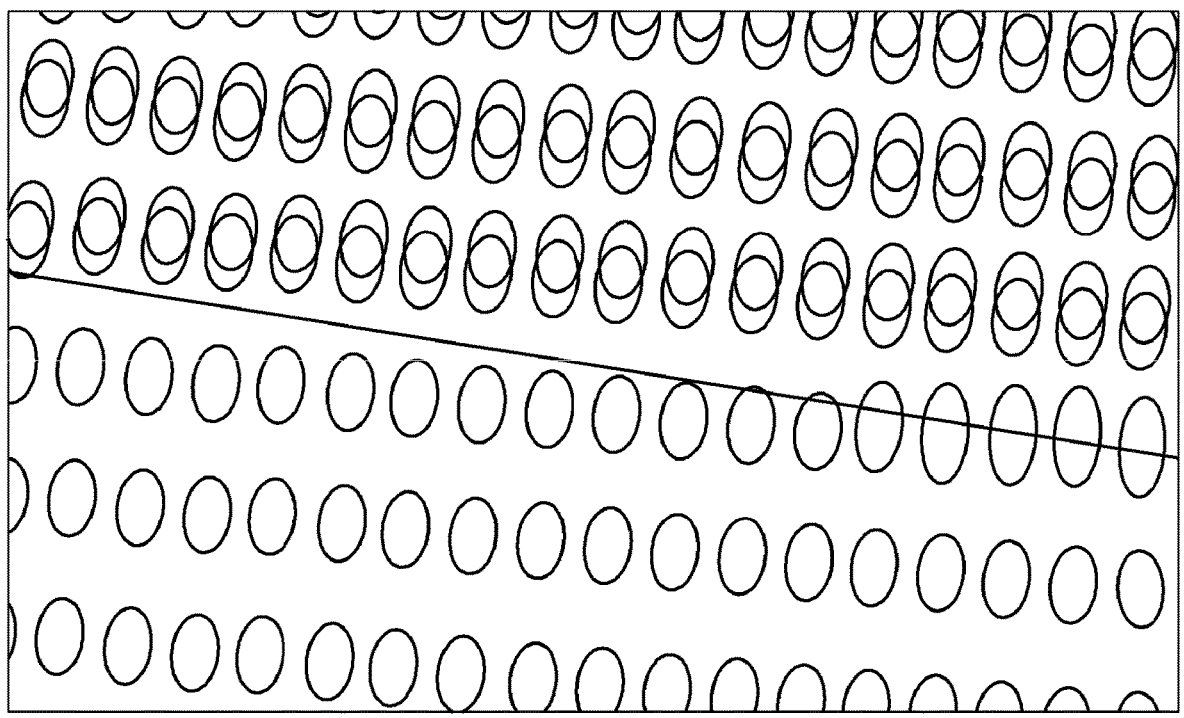

In case of organic light emitting display devices requiring adjustment of a viewing angle in a specific direction, including display devices for vehicles, an attempt to additionally dispose an optical film to satisfy requirements has been made. However, in order to bond a separate optical film to an organic light emitting display device, additional materials (e.g., a film, an adhesive, etc.) and a bonding process may be additionally utilized. Further, the possibility of defects during the bonding process should be considered. Further, the thickness of the organic light emitting device is considerably increased due to addition of the optical film and the adhesive, and luminance of the organic light emitting display device is lowered due to lowering of light transmittance caused by use of the film and the adhesive. Further, as exemplarily shown in FIGS. 3D and 3E, when light emitted by the display panel 100 passes through an optical film having light blocking patterns LAP alone provided thereon, a part of the light is totally reflected by some regions of the surfaces of the light blocking patterns LAP and thus a virtual image together with an actual image is displayed. That is, a user may view a picture including a virtual image. Such a phenomenon is referred to as a double image. The double image is also referred to as ghost mura.

Therefore, the inventors of the present disclosure researched a solution to reduce or minimize increase in manufacturing costs and process time/complexity and to improve non-occurrence of ghost mura (e.g., by use of a viewing angle adjustment method). The cover member 300 in accordance with one embodiment of the present invention, deduced by the above research, may be configured such that light path control patterns 320 including light path control elements 321 and 322 are integrated with the inside of the cover member 300, as exemplarily shown in FIG. 3B.

Referring to FIG. 3A, the light path control patterns 320 extending in the horizontal direction is disposed to adjust a viewing angle in upward and downward directions. In order to adjust the viewing angle in leftward and rightward directions, the light path control patterns 320 may extend in the vertical direction. As exemplarily shown in FIG. 3B, a refractive index matching layer 322 is disposed between light blocking patterns 321 and a light transmission part 330.

The light path control structure is disposed on one surface of a transparent base material 310 formed of glass or plastic. In one or more embodiments, the light path control structure may include the light blocking patterns 321, the refractive index matching layer 322, and the light transmission part 330. In particular, the light path control structure may include the light blocking patterns 321 to block light incident upon the cover member 300 at a designated angle or more, the light transmission part 330 to transmit light incident upon the cover member 300 at less than the designated angle, and the refractive index matching layer 322 disposed between the light blocking patterns 321 and the light transmission part 330 to reduce total reflection of light, emitted by the display panel and then incident upon the cover window 300, by the light blocking patterns 321. In other embodiments, the light path control structure may include other components (such as the shielding layer 350). The light blocking patterns 321 may include a polymer (for example, a resin or the like) including a light absorbing material (for example, a black pigment or paint or the like) which may block (or absorb) light. The refractive index matching layer 322 may include a hollow silica-based material or a fluorine containing compound (for example, LiF, MgF, 3NaF, AlF, $Na_3AlF_6$ or the like) having a refractive index of about 1.3 to 1.45. The refractive index matching layer 322 may have a thickness of about 70 to 220 nm.

Further, the light transmission part 330 may include a polymer (for example, acryl or the like) having transmittance of a designated level or more (for example, of about 80% or more). The light transmission part 330 fills remaining areas except areas for forming the light path control patterns 320 including the light blocking patterns 321 to block light incident upon the cover member 300 at the designated angle or more and the refractive index matching layer 322 to reduce total reflection of light incident upon the light blocking patterns 321, and the shielding layer 350 provided at the edge of the cover member 300 to prevent transmission of light.

Light proceeding in parallel with or at less than a designate angle from the height direction of the light blocking patterns 321 (the vertical direction in FIG. 3B) passes through the light path control structure (and the transparent base material 310).

However, light proceeding at the designated angle or more from the height direction of the light blocking patterns 321 is blocked by the light blocking patterns 321. Therefore, as exemplarily shown in FIG. 3C, as the viewing angle is increased in upward and downward directions, an amount of light emitted in the corresponding directions is decreased. Therefore, in terms of visibility, a screen is unrecognizable at more than a specific viewing angle. That is, an image formed by the display device is invisible at a viewing angle greater than a specific reference (for example, about 45° in the upward direction).

The light blocking patterns 321 playing a major role in blocking light may have a column shape having a circular, oval or polygonal horizontal section. Particularly, the light blocking patterns 321 may have a column shape, the cross-sectional area of which is gradually decreased in a direction from the display panel 100 to the transparent base material 310. Here, the light blocking patterns 321 may have a trapezoidal vertical section, e.g., cross-section in the height direction (vertical direction). Here, oblique sides of the trapezoidal vertical section may have gradients in consideration of blocking and transmission of light, and, if different viewing angles in the upward and downward directions (or in the leftward and rightward directions) are implemented, the opposite oblique sides of the trapezoidal vertical section may be asymmetrical to each other, e.g., may have different gradients.

The light blocking patterns 321 have a height and a pitch based on a designated angle of light to be blocked or transmitted. That is, as an optical angle of light to be blocked is increased (as a viewing angle to be implemented is decreased), the height of the light blocking patterns 321 may be increased or the pitch between the light blocking patterns 321 may be narrowed. Further, the light blocking patterns 321 have a width of about 20 to 30 µm which is less visible to the human eyes. For example, in order to provide a viewing angle of about 30°, the light blocking patterns 321 may have a height of about 100 µm and be arranged at a pitch of about 39 µm.

The refractive index matching layer 322 is located between the light blocking patterns 321 and the light transmission part 330, and the inner and outer surfaces of the refractive index matching layer 322 contact the light blocking patterns 321 and the light transmission part 330. For example, the refractive index matching layer 322 may cover remaining three surfaces of the light blocking patterns 321 except for the lower surfaces of the light blocking patterns 321, as exemplarily shown in FIG. 3B. The refractive index matching layer 322 may be formed of a fluorine containing compound, such as LiF, MgF, 3NaF or AlF, or be formed of a hollow silica-based material. The refractive index matching layer 322 may have a refractive index of about 1.3 to 1.45 and a thickness of about 70 nm to 220 nm.

Total reflection may occur due to a refractive index difference between the light transmission part 330 and the light blocking patterns 321. For example, if there is a refractive index difference between the light transmission part 330 and the light blocking patterns 321, light incident upon the light blocking patterns 321 through the light transmission part 330 may be reflected due to the refractive index difference between the light transmission part 330 and the light blocking patterns 321. Therefore, the refractive index matching layer 322 is disposed between the light transmission part 330 and the light blocking patterns 321, and thus light transmitted by the refractive index matching layer 322 may cause phase retardation of light reflected by the interfaces between the refractive index matching layer 322 and the light blocking patterns 321, thus cause destructive interference with the light reflected by the interfaces between the refractive index matching layer 322 and the light blocking patterns 321 and thereby suppress the reflected light. For this purpose, the refractive index matching layer 322 may be designed to have a lower refractive index than the refractive indexes of the light transmission part 330 and the light blocking patterns 321. For example, if the refractive index of the light transmission part 330 is about 1.5 and the refractive index of the light blocking patterns 321 is about 1.6, the refractive index matching layer 322 may have a refractive index of about 1.3 to 1.45.

The cover member 300 has the shielding layer 350 configured to shield the outside of an area in which an image is displayed, on one surface of the cover member 300 on which the light path control patterns 320 are disposed. The shielding layer 350 may be an opaque mask layer including a black ink (for example, a polymer filled with carbon black). Here, the shielding layer 350 and the light blocking patterns 321 may be black having substantially the same color sense, and a difference in the color senses between the shielding layer 350 and the light blocking patterns 321 is almost imperceptible. For example, a color difference between the shielding layer 350 and the light blocking patterns 321 may be 3 or less. Here, the color difference is a difference between two colors defined by differences $\Delta L^*$, $\Delta a^*$ and $\Delta b^*$ of coordinates ($L^*$, $a^*$, $b^*$) in the CIE $L^*a^*b^*$ color space, and is expressed as $\Delta E$, as stated in Equation 1 below.

$$\Delta E = (\Delta L^{*2} + \Delta a^{*2} + \Delta b^{*2})^{1/2} \quad \text{[Equation 1]}$$

Here, $L^*$ is a lightness value of reflected light, and $a^*$ and $b^*$ are CIE color coordinates.

The cover member 300 is adhered to the display panel 100 or the functional member 200 through an adhesive, such as an optically clear adhesive (OCA).

The cover member 300 in accordance with one embodiment of the present disclosure may adjust the viewing angle of the organic light emitting display device without addition of a separate optical film. Therefore, increase in the thickness and manufacturing costs of the organic light emitting display device is effectively suppressed. Further, a manufacturing process of the organic light emitting display device using the cover member 300 is simple, as compared to a process of adding a separate optical film, and, thus, defects in manufacture of the organic light emitting display device may be greatly reduced. In addition, the refractive index matching layer 322 may reduce total reflection of light occurring in the light blocking patterns 321 and thus overcome occurrence of ghost mura. FIGS. 4A to 4G are cross-sectional views illustrating a method for manufacturing the cover member in accordance with one embodiment of the present disclosure.

The cover member 300 is located as the uppermost layer of the organic light emitting display device and thus protects the display panel 100 or the function member 200 from external shock. Further, the cover member 300 may include the light path control structure and thus maintain the viewing angle of the organic light emitting display device within a specific range or less. In some embodiments, the cover member 300 may be referred to as a cover window 300.

Now, a method for manufacturing the cover window 300 of the organic light emitting display device will be exemplarily described below. First, as exemplarily shown in FIG. 4A, the shielding layer 350 configured to shield the outside of an area of the display panel 100 in which an image is displayed is formed on one surface (or on a portion of a surface) of the transparent base material 310. The shielding layer 350 is disposed corresponding to an inactive area of the display panel 100, and thus may hide various additional elements (e.g., circuits, wirings, etc.) provided in the inactive area. The transparent base material 310 may be glass or plastic, and the shielding layer 350 may be placed on one surface of the transparent base material 310 facing the display panel 100. One example of the shielding layer 350 includes a black matrix. Other suitable materials or structures for performing the various aspects of the shield layer 350 may be utilized and thus is not limited to the above example.

Figure 4A:
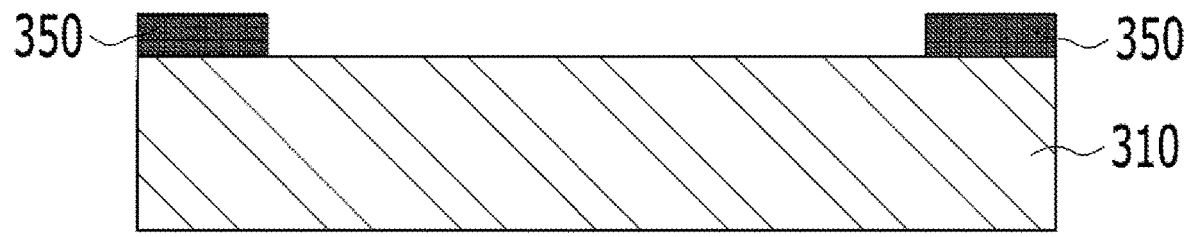
FIGS. 4A to 4G are cross-sectional views illustrating a method for manufacturing the cover member in accordance with one embodiment of the present disclosure.
Figure 4B:
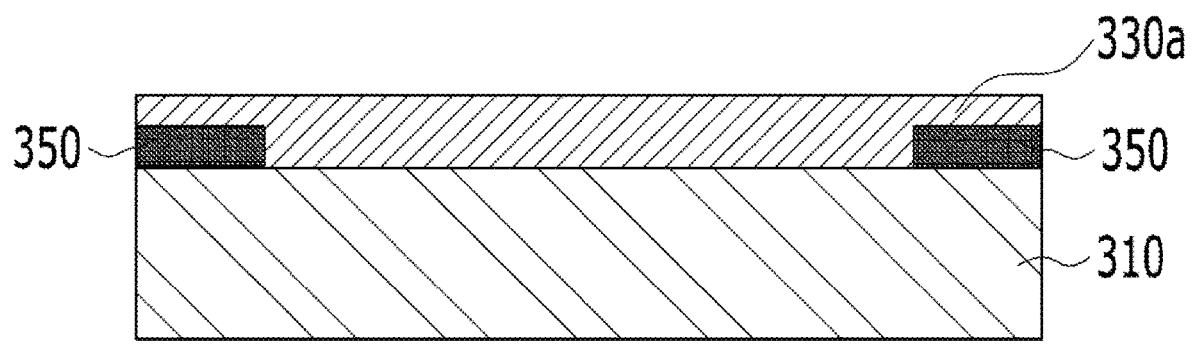

Thereafter, as exemplarily shown in FIG. 4B, the surface of the transparent base material 310 on which the shielding layer 350 is provided is coated with a transparent resin 330a. The transparent resin 330a is the same material as the material of the light transmission part 330 described above with reference to FIG. 3B, and, for example, may be a polymer (for example, a polyester-based polymer, acryl or the like) having transmittance of a designated level or more (for example, of about 80% or more). Here, the transparent resin 330a may be applied up to the surface of the shielding layer 350, and be applied to the surface of the shielding layer 350 to have a designated thickness from the surface of the shielding layer 350.

Figure 4C:
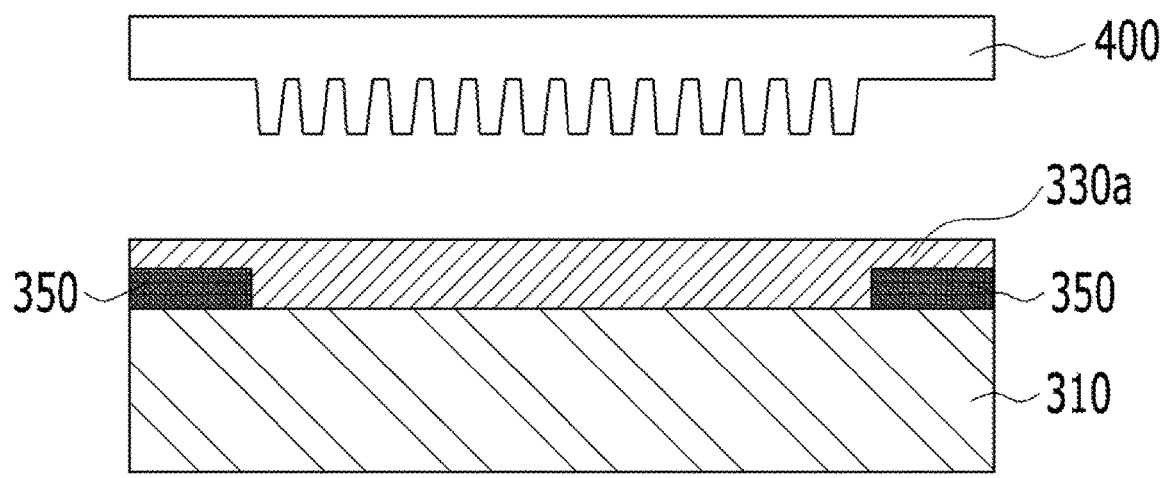

Thereafter, as exemplarily shown in FIG. 4C, a mold 400 is pressed onto the applied transparent resin 330a and thus forms grooves which will be filled with light blocking patterns. Such light blocking patterns are equal to the light blocking patterns 321 described above with reference to FIG. 3B. The grooves which will be filled with the light blocking patterns have a designated height and pitch, and the designated height and pitch of the grooves are determined based on an angle of light, external emission of which is blocked, among light incident upon the cover window 300. A detailed description thereof is substantially the same as the description of the light blocking patterns 321, given above with reference to FIG. 3B. As exemplarily shown in this figure, in order to increase convenience of separation of the mold 400 from the surface of the transparent resin 300a, e.g., upward movement of the mold 400 after formation of the grooves by pressing the mold 400 onto the surface of the transparent resin 330a, the grooves may have a vertical section having a trapezoidal shape. Such a trapezoidal shape of the grooves may be easily maintained while the mold 400 is separated from the surface of the transparent resin 330a.

Figure 4D:
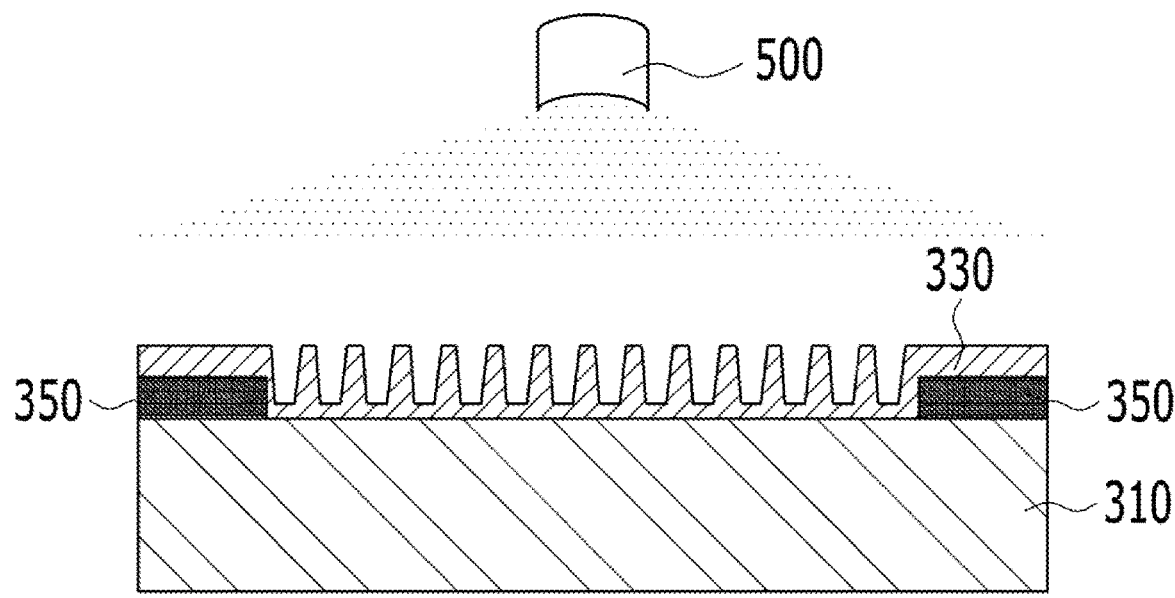

Thereafter, as exemplarily shown in FIG. 4D, the transparent resin 330 provided with the grooves formed thereon is cured. Curing of the transparent resin 330 may be performed by ultraviolet (UV) curing or heat curing through a curing apparatus 500 according to a method suitable for characteristics of the transparent resin 330.

Figure 4E:
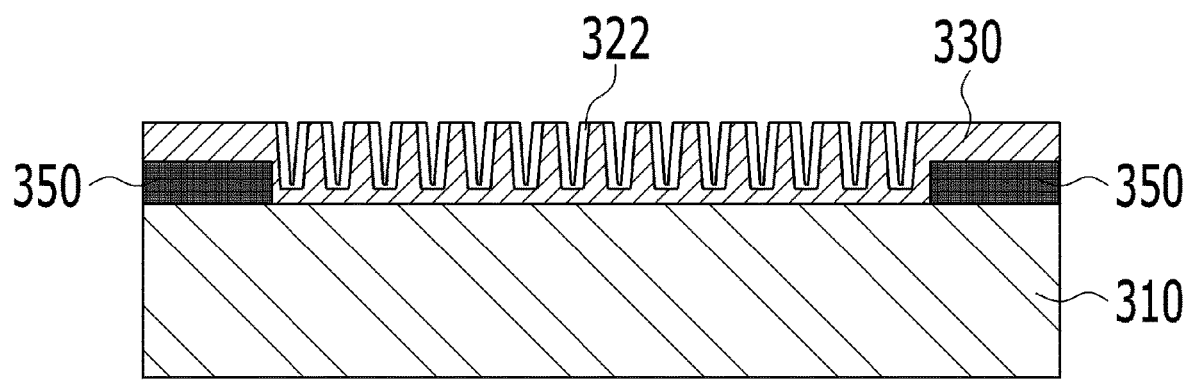

When the transparent resin 330 is cured, as exemplarily shown in FIG. 4E, the refractive index matching layer 322 is formed by coating the inner surfaces of the grooves with a refractive index matching material. The refractive index matching material may be coated on the inner surfaces of the grooves using a spraying method or a gravure printing method.

Figure 4F:
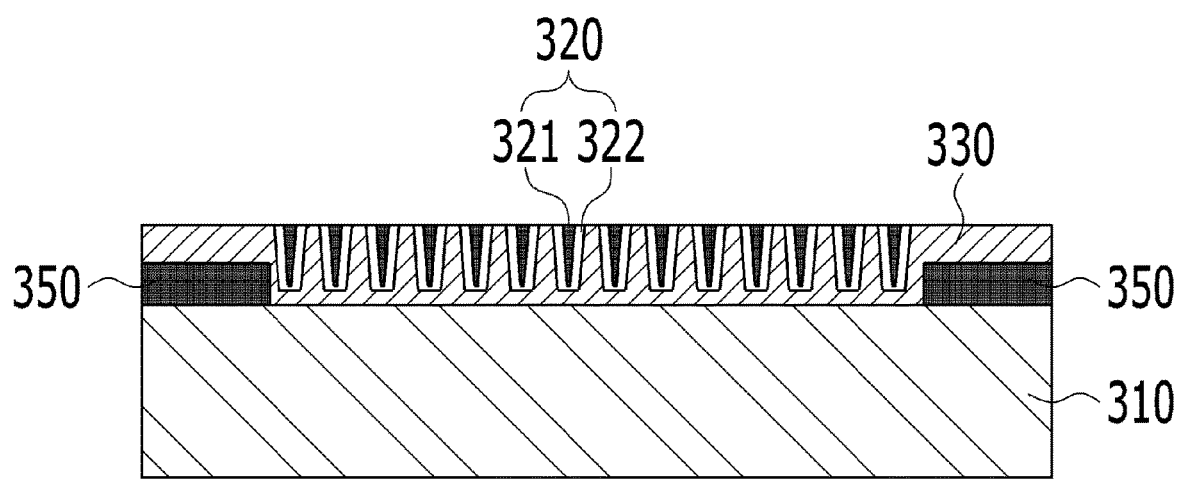
Figure 4G:
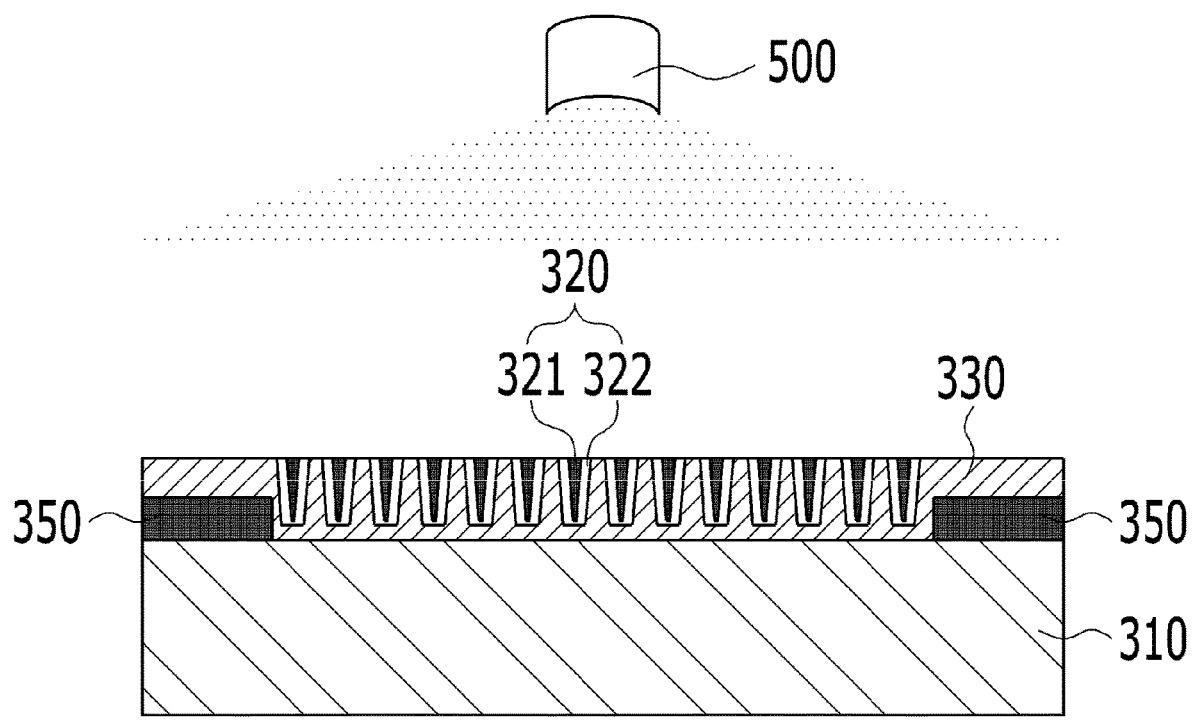

Thereafter, as exemplarily shown in FIG. 4F, the grooves having the refractive index matching layer 322 formed on the inner surfaces thereof are filled with an opaque resin, and the opaque resin is cured, thus completing formation of the light blocking patterns 321. In the same manner, curing of the opaque resin may be performed by UV curing or heat curing according to a method suitable for characteristics of the opaque resin forming the light blocking patterns 321.

The surface of a viewing angle control layer, in which formation of the light blocking patterns 321 is completed, may be uneven. Therefore, the surface of the viewing angle control layer may be planarized through a grinding process. Thereby, the light path control patterns 320 including the refractive index matching layer 322 coating the inner surfaces of the grooves and the light blocking patterns 321, the three surfaces of which are covered with the refractive index matching layer 322 except for the surfaces of the light blocking patterns 321 disposed opposite to the display panel 100 (in FIG. 1), are formed.

The cured transparent resin 330 on the transparent base material 310 except for the light path control patterns 320 and the shielding layer 350 functions as the light transmission part 330 in the completed cover window 300.

The cover window 300 manufactured by the method shown in FIGS. 4A to 4G is adhered to the display panel 100 or the function member 200 provided thereon, thus completing manufacture of the organic light emitting display device 1000. The organic light emitting display device 1000 may adjust an angle of visibility of an image through the light path control patterns 320 included in the cover window 300 and overcome ghost mura caused by total reflection by the light blocking patterns 321, thus having improved display quality.

The organic light emitting display device in accordance with one embodiment of the present disclosure will be described below.

The organic light emitting display device in accordance with one embodiment of the present disclosure includes the display panel to display an image, and the cover window located above the display panel. The cover window may include the light path control structure to adjust a range of visibility of the image displayed by the display panel and to prevent occurrence of ghost mura. The light path control structure may include the light blocking patterns 321 configured to block light incident upon the cover window at a designated angle or more, the refractive index matching layer 322 configured to cover the light blocking patterns and to prevent the light incident upon the cover window from being totally reflected by the light blocking patterns 321, and the light transmission part 330 configured to transmit light incident upon the cover window at less than the designated angle.

The light blocking patterns 321 formed in a column shape have a height and a pitch based on the designated angle, and may thus adjust a viewing angle of the image displayed by the display panel.

The light blocking patterns 321 have a cross-sectional area which is gradually decreased in a direction far away from the display panel, and have a trapezoidal vertical section. Oblique sides of the trapezoidal vertical section may have gradients in consideration of blocking and transmission of light and be asymmetrical to each other.

The light blocking patterns 321 may include a polymer including a light absorbing material, and the refractive index matching layer may include a material having a refractive index of about 1.3 to 1.45. The refractive index matching layer may have a thickness of about 70 to 220 nm. The refractive index matching layer may include a fluorine containing compound (for example, LiF, MgF, 3NaF, AlF, $Na_3AlF_6$ or the like) or a hollow silica-based material. The light transmission part may include a polymer having transmittance of about 80% or more.

In the cover window, the light path control structure may be disposed on one surface of the transparent base material formed of glass or plastic, and the shielding layer configured to shield the outside of an area in which an image is displayed may be provided on the surface of the cover window on which the light path control structure is disposed. That is, the light path control structure is integrated with the cover window, and may thus adjust a viewing angle of the organic light emitting display device without addition of a separate optical film.

As apparent from the above description, the embodiments of the present disclosure may provide a cover window of an organic light emitting display device, which has a function of adjusting a viewing angle. The cover window may provide the viewing angle adjustment function while reducing or minimizing increase in the thickness and manufacturing costs of the organic light emitting display device. Further, the cover window may overcome ghost mura through a functional layer to adjust the viewing angle.

It will be apparent to those skilled in the art that various modifications and variations can be made in the present disclosure without departing from the spirit or scope of the disclosure. Thus, the embodiments of the present disclosure are provided only to explain the disclosure, and the embodiments of the disclosure do not limit the present disclosure. Characteristics of the various embodiments of the present disclosure may be partially or entirely connected to or combined with each other and technically variously driven and interlocked with each other so as to become apparent to those skilled in the art, and the respective embodiments may be independently implemented or be implemented together in connection with each other. Accordingly, it is intended that the present disclosure cover the modifications and variations of this disclosure provided they come within the scope of the appended claims and their equivalents.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a display panel configured to display an image; and
a cover window located on the display panel,
wherein the cover window includes a light path control structure, and
wherein the light path control structure comprises:
a plurality of light blocking patterns configured to block light incident upon the cover window at a designated angle or greater, wherein each of the light blocking patterns has a cross-sectional area gradually decreased in a direction far away from the display panel and has a trapezoidal vertical section;
a refractive index matching layer on each of the light blocking patterns, the refractive index matching layer fully covering at least an upper surface of each of the light blocking patterns, wherein the refractive index matching layer is configured to prevent the light incident upon the cover window from being totally reflected by the light blocking patterns; and
a light transmission part on the refractive index matching layer.

2. The organic light emitting display device according to claim 1, wherein the
light transmission part is configured to transmit light incident upon the cover window at less than the designated angle.

3. The organic light emitting display device according to claim 1, wherein the light blocking patterns extend in a horizontal direction, and have a height and a pitch based on the designated angle.

4. The organic light emitting display device according to claim 1, wherein oblique sides of the trapezoidal vertical section have gradients in consideration of blocking and transmission of light.

5. The organic light emitting display device according to claim 4, wherein the oblique sides of the trapezoidal vertical section are asymmetrical to each other.

6. The organic light emitting display device according to claim 1, wherein the light blocking patterns comprise a light absorbing material.

7. The organic light emitting display device according to claim 1, wherein a first refractive index of the light blocking patterns is greater than a second refractive index of the refractive index matching layer, and the second refractive index is about 1.3 to 1.45.

8. The organic light emitting display device according to claim 7, wherein the refractive index matching layer has a thickness of about 70 nm to 220 nm.

9. The organic light emitting display device according to claim 7, wherein the refractive index matching layer comprises at least one of a fluorine containing compound or a hollow silica-based material.

10. The organic light emitting display device according to claim 9, wherein the fluorine containing compound comprises at least one selected from the group consisting of LiF, MgF, 3NaF, AlF and $Na_3AlF_6$.

11. The organic light emitting display device according to claim 2, wherein the light transmission part comprises a polymer having transmittance of about 80% or more.

12. The organic light emitting display device according to claim 1, wherein the light path control structure is disposed on one surface of a transparent base material formed of glass or plastic, in the cover window.

13. The organic light emitting display device according to claim 1, further comprising a shielding layer in the cover window, wherein the shielding layer is disposed, not to overlap with the light blocking patterns and the shielding layer is corresponding an outside of an area in which the image is displayed, and wherein the shielding layer has a shorter height than the light blocking patterns.

14. The organic light emitting display device according to claim 1, wherein the light transmission part includes a first part over the light path control structure with a certain thickness, and a second part between adjacent refractive index matching layers on side surfaces of the spaced light blocking patterns, wherein the first part is disposed where the cover window is not facing the display panel.

15. The organic light emitting display device according to claim 1,
wherein the refractive index matching layer prevents occurrence of ghost mura by reducing total reflection of the light on the light blocking patterns.

* * * * *